United States Patent [19]

Choi

[11] Patent Number: 5,067,001
[45] Date of Patent: Nov. 19, 1991

[54] STRUCTURE AND METHOD FOR MANUFACTURING A SERIES READ ONLY MEMORY WITH SPACER FILM

[75] Inventor: Jung-Hyuk Choi, Seoul, Rep. of Korea

[73] Assignee: SamSung Electronics Co., Ltd., Suwon, Rep. of Korea

[21] Appl. No.: 607,760

[22] Filed: Oct. 30, 1990

Related U.S. Application Data

[63] Continuation of Ser. No. 359,125, May 31, 1989, abandoned.

[30] Foreign Application Priority Data

May 5, 1989 [KR] Rep. of Korea ............ 1989/6137[U]

[51] Int. Cl.⁵ ............................................. H01L 29/34
[52] U.S. Cl. .................................... 357/54; 357/23.12; 357/23.14; 307/448
[58] Field of Search ................... 357/23.12, 54, 23.14, 357/23.1; 307/448

[56] References Cited

U.S. PATENT DOCUMENTS 4,142,176 2/1979 Dozier .................................. 357/41
4,380,863 4/1983 Rao ..................................... 357/23.14
4,385,308 5/1983 Uchida ................................ 357/54

FOREIGN PATENT DOCUMENTS 54-18687 2/1979 Japan ................................ 357/23.14

OTHER PUBLICATIONS

Dockerty, "Semiconductor Hole Fabricating," Aug. 1983, *IBM Technical Disclosure Bulletin*, vol. 26, No. 3A, pp. 1091–1093.

*Primary Examiner*—Andrew J. James
*Assistant Examiner*—Courtney A. Bowers
*Attorney, Agent, or Firm*—Robert E. Bushnell

[57] ABSTRACT

Disclosed is a device and method for manufacturing a mask read only memory (ROM) using a spacing film and NAND logic to attain high integration density. Side wall layers are separated between connection regions and reference regions with gate oxide layers formed on a surface of the substrate and gate electrode formed over side walls of the side wall layers placed between each of the gate oxide layers and adjacent memory cells. Channel regions having a first conductivity type of ion are formed under memory cells adjacent to the connection region and oxide layers of selected memory cells. Channel regions exhibiting a second conductivity type of ion are formed under the oxide layers of the non-selected memory cells and the side wall layers.

24 Claims, 6 Drawing Sheets

STRUCTURE AND METHOD FOR MANUFACTURING A SERIES READ ONLY MEMORY WITH SPACER FILM

This is a continuation of application Ser. No. 07/359,125 filed in the U.S. Patent & Trademark Office on May 31, 1989 now abandoned. Priority is claimed under 35 U.S.C. §119 and section 120 based upon an application filed in the Republic of Korea on May 8, 1989 and assigned Application No. 1989/6137 now abandoned.

BACKGROUND OF THE INVENTION

This invention relates to a mask read only memory (ROM), and more particularly to a structure and method for manufacturing a read only memory with a spacer film.

A mask programmable ROM is occasionally called a mask ROM. In data processing systems, a mask ROM is used for memorizing game contents in a game chip, or for storing control logic such as a microprogram. It is desirable that the control logic be integrated with high density and occupy smaller area. There is disclosed a ROM structure having a series-connected NAND logic as a ROM structure used for memorizing relatively by far more information of control logic in a fixed area. The art is disclosed in U.S. Pat. No. 4,142,176. The prior art is a ROM structure in which a plurality of depletion-mode and enhancement-mode transistors are arranged in the form of a series-connected NAND logic matrix. Gates of the transistors on each row share one row line, with sources and drains of adjacent transistors placed in a string of each column are connected in series in an electrical manner on each column.

Therefore, in such a ROM structure of NAND logic type, an insulating layer on the sources and drains of adjacent transistors in a string has been used as an insulator for separating row lines therebetween. However, in a ROM which includes a plurality of series-connected transistors arranged in an array of rows and columns, a ROM structure having the sources and drains, and an insulating layer thereon can not provide a higher integrated-density in a fixed area.

SUMMARY OF THE INVENTION

It is according an object of the present invention to provide a method for manufacturing a read only memory (ROM) having a high-integration density.

It is another object of the present invention to provide a method for producing a read only memory (ROM) in a structure of NAND logic having a high-integrated density.

To attain the above-mentioned objects, a mask read only memory having a plurality of memory strings, in which a pluality of memory cells are connected between each of the contact regions in a second conductive type on a semiconductor substrate in a first conductive type and a reference region in a second conductive type, includes: side wall layers separated by a given distance between a connection region and reference region in order to isolate the memory cells of each of the memory strings; gate oxide layers formed on the surface of said substrate on which said memory cells are formed; a gate electrode formed over side walls of side wall layers placed between each of said gate oxide layers and adjacent memory cells; channel regions having the first conductivity type of ion under a memory cell adjacent to said connective region and oxide layer or layers of a selected memory cell or cells; and channel regions having the second conductivity type of ion under oxide layer or layers of a non-selected memory cell or cells and said side wall layers.

BRIEF DESCRIPTION OF THE DRAWINGS

For a better understanding of the invention and to show how the same may be carried into effect, reference will now be made, by way of example, to the accompanying diagrammatic drawings, in which.

DETAILED DESCRIPTION OF THE INVENTION

Figure 1:
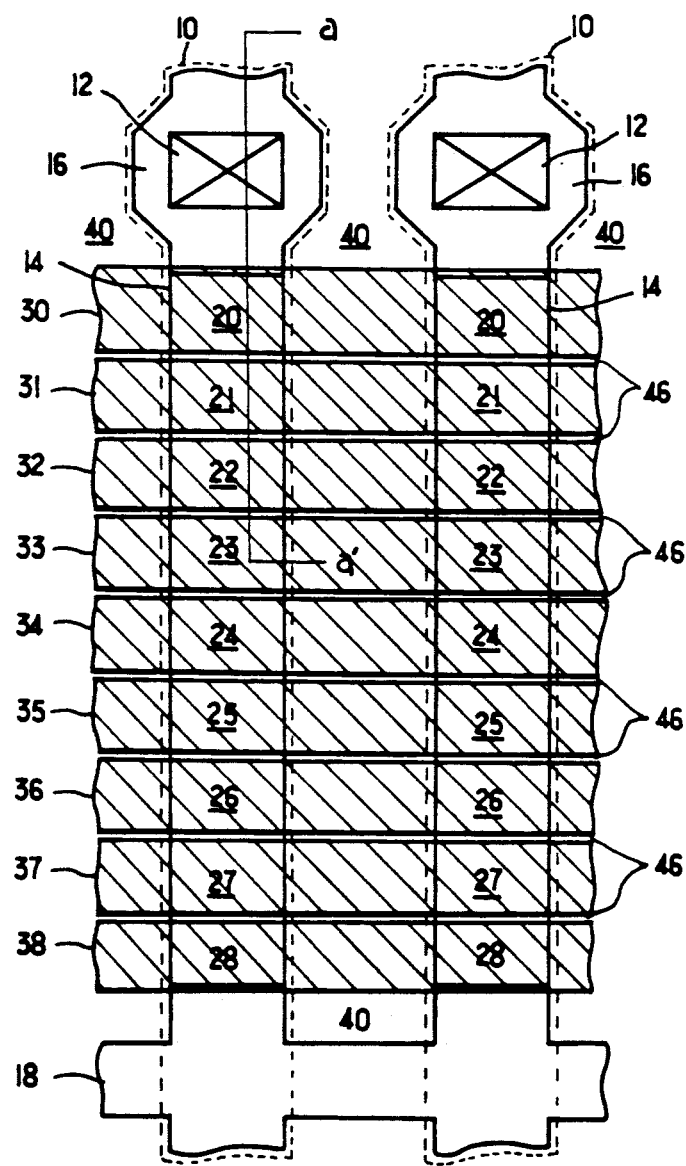
FIG. 1 is a top view of a portion of a ROM in the structure of NAND logic, according to the present invention.

The above and other objects, effects and features of the present invention will become more apparent from the following description of preferred embodiments thereof taken in conjunction with the accompanying drawings. Same reference numerals are used to designate similar parts throughout the figures.

FIG. 1 is a top view of a portion of a ROM in the structure of NAND logic type, according to the invention, showing only two memory strings for the convenience of explanation. It is herein defined that a memory string 14 is a group of series-connected cells 20 to 28 between each column line 10 and a region applying a reference voltage.

Figure 2:
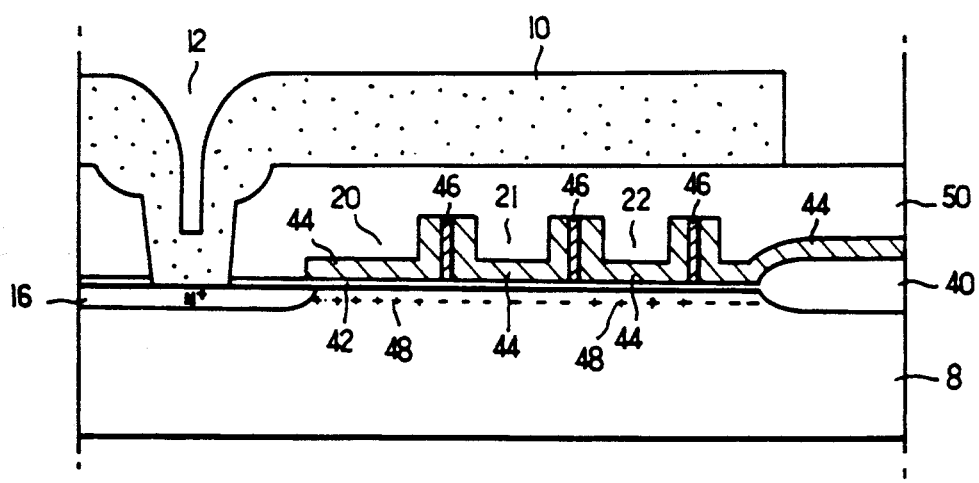
FIG. 2 is a cross-sectional view taken along to the line a—a' in FIG. 1.

Referring to FIG. 1 and FIG. 2, the ROM structure with respect to the invention will now be explained. On a p-type substrate surface are formed a N+ connection region 16 connected to a conductive column line 10 through a open hole 12 and a field oxide layer 40 for isolating an N+ reference region 18 connected to a reference voltage identical with the ground voltage from memory strings 14. Also, series-connected cells 20 to 28 are formed on the surface of the substrate 8 under the column line 10 between the N+ connection region 16 and N+ standard region. The cells include a string select cell 20 and eight ROM cells 21 to 28. It is well known to those skilled in this field of art that ROM cells cannot be specified by only eight cells. The individual cells 20 to 28 have a thin gate oxide layer 42 such as SiO$_2$ formed on the surface of the substrate and a conductive gate electrode 44 on the gate oxide layer 42. The gate electrode 44 may be N+ doped polycrystalline silicon. Further, between the cells, side walls 46 of an insulating material such as SiO$_2$ are formed to isolate the gate electrodes 44 from each other. And the gate electrodes 44 of adjacent cells are formed on both side walls of the side wall layer 46. Besides, a channel region 48 under the gate electrode 44 of each ROM cell 21 to 28 can be programmed by N or P-type ion implantation. P-type ion implantation is employed on the channel region 48 corresponding to string select cell 20. A cell in which p-type ions are implanted into the channel region 48 of the p-type substrate operates in the same manner as in a conventional enhancement-mode MOS- FET transistor, and a cell in which N-type ions are implanted operates in the same manner of a depletion-mode MOSFET transistor.

Therefore, in the present invention, a program means that ROM cells are manufactured in enhancement-mode or depletion-mode by ion implantation technique. For example, it is assumed that a ROM cell 22 is programmed with enhancement-mode, a positive voltage to the gate electrode 44 of the ROM cell 22 enables the channel region 48 of the ROM cell 22 to be in a conductive state and a application of a ground potential enables the cell to be in a non-conductive state. On the other hand, when it is assumed that a ROM cell 22 is programmed by depletion-mode, in spite of ground state, the channel region 48 of the ROM cell 22 will be in conductive state.

An insulating layer 50 is formed on the gate electrode 44, and the column line 10 is formed on the insulating layer 50 and connected with the connection region 16 through the open hole 12. Meanwhile, the gate electrodes 44 of the cells 20 to 28 were coupled to row lines 30 to 38 which are extended perpendicularly to the column line 10. The material of the column lines 30 to 38 may be a doped-polycrystalline silicon which is the same material as that of the gate electrodes 44.

Figure 3:
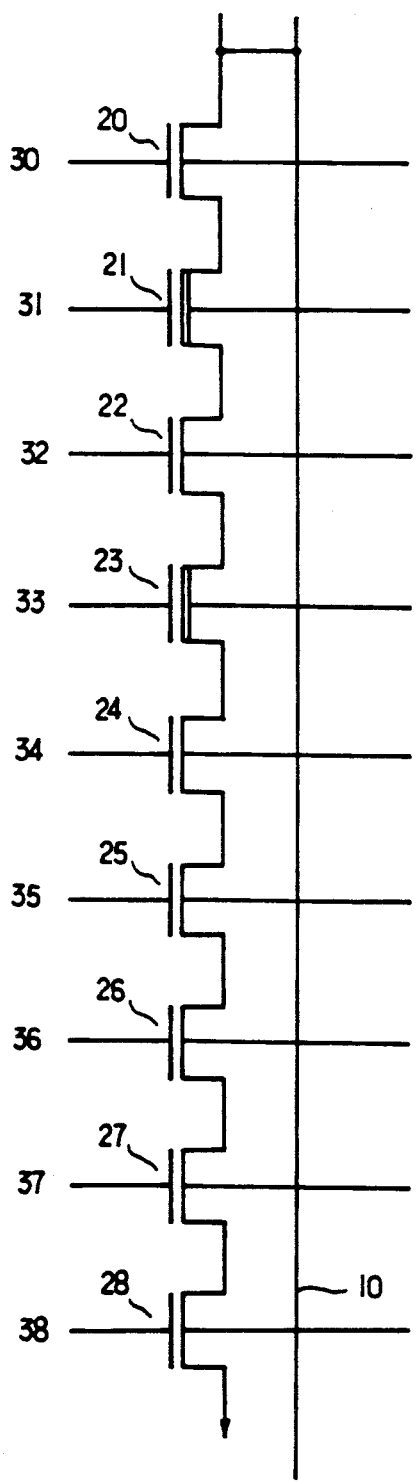
FIG. 3 is a specific diagram illustrating an equivalent circuit of a memory string connected between a row line and a ground in FIG. 1.

As shown in FIG. 3, it is assumed that ROM cells 21 and 23 are programmed by depletion-mode, and the remaining ROM cells are programmed by enhancement-mode. Then, the readout operation of the ROM cell 23 will be explained in detail. In order to read logic information stored in the ROM cell 23, about 2 V is applied to the selected column line 10 and ground voltage is applied to select the row line 33. At the same time, power supply Vcc (5 V) is applied to a string select row line 30 and non-selected row lines 31, 32 and 34 to 38. If so, because all the cells including the ROM cell 23 are conductive, the selected column line 10 is grounded, and reads are a logic "0". But, if assumed that the ROM cell 23 is programmed by enhancement-mode, because the ROM cell 23 is nonconductive, the selected column line 10 maintains 2 V, which reads a logic "1".

Figure 4A:
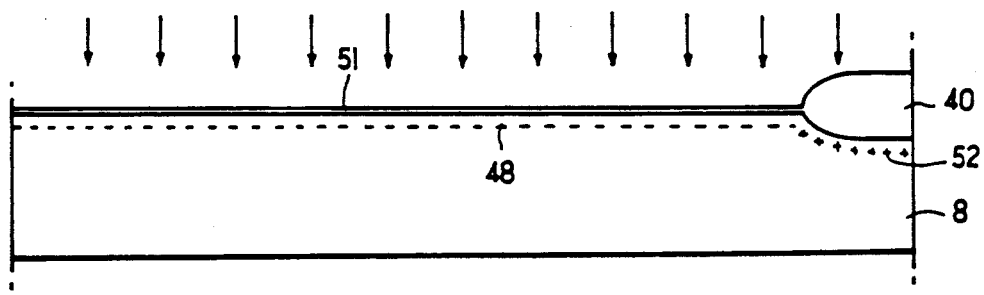
FIG. 4(A) to 4(G) are cross-sectional views showing a manufacturing process taken along line a—a' in FIG. 1.

Referring to FIG. 4(A), the p-type substrate 8 is a wafer oriented to <100> and with resistance of 5 to 50 Ω-cm. The p-type substrate may be of p-type well. On the surface of the substrate 8 is formed the field oxide layer 40 of about 5000 Å and a P+ channel stopper layer 52 under a pad oxide layer 51 of about 380 Å and the field oxide layer 40 by well known LOCOS (Local Oxidation of Silicon) in order to define an active region formed with the memory strings. After this processing, in order to turn the channel regions 48 into depletion, arsenic (As) ions about 100 KeV are implanted with the dose of about $2.0 \times 10^{12}$ ions/cm$^2$.

Figure 4B:
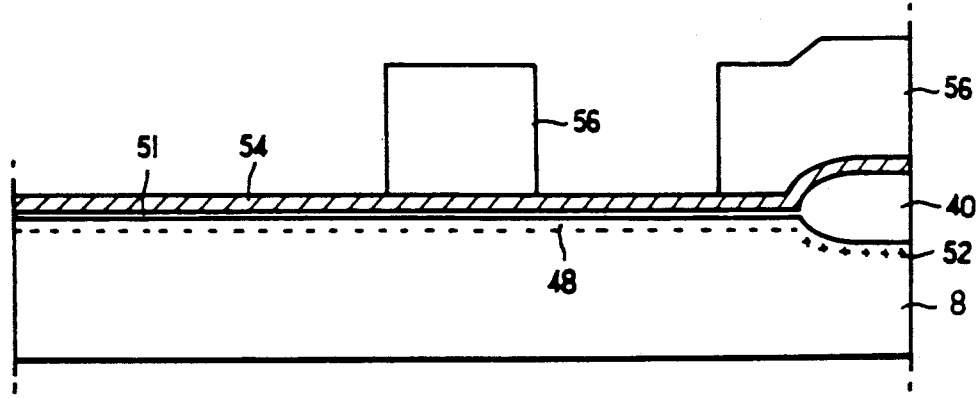

As shown in FIG. 4(B), a first silicon nitride layer 54 having a thickness of about 500 Å is formed on the oxide layers 51, 40 and a silicon oxide layer having a thickness of 7000 Å is deposited over the first silicon nitride layer 54 by means of a conventional CVD (Chemical Vapor Deposition) process. A silicon oxide layer 56 is etched by a photolithography method in order to form insulating side wall layers for isolating the cells therebetween. It should be noted that the height of the oxide layer 56 from the substrate surface 8 is higher than that of the field oxide layer 40 from the substrate surface.

Figure 4C:
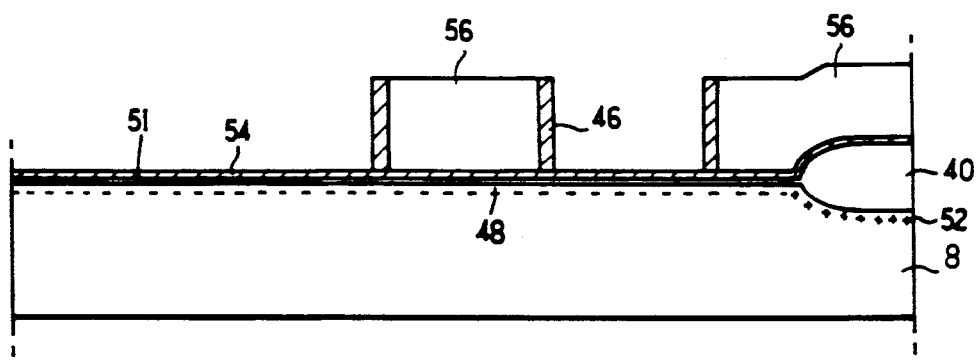
Figure 4D:
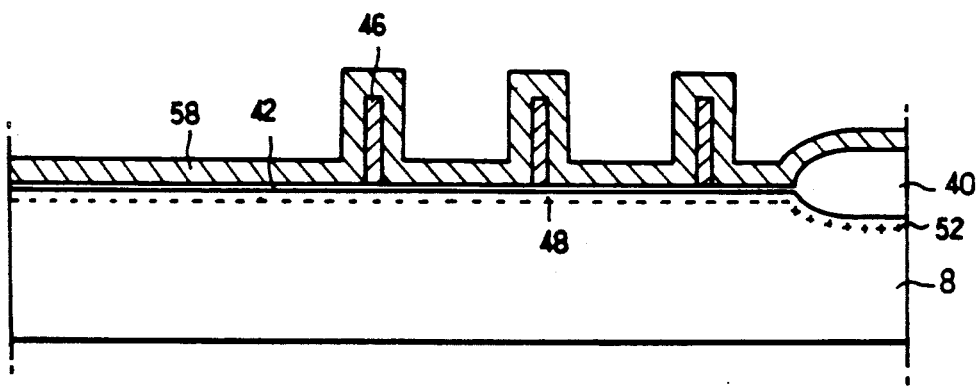

Thereafter, as shown in FIG. 4(C), after a silicon nitride layer having a thickness of about 1000 Å is deposited on the entire surface of the structure in shown in FIG. 4(B), an side wall layer of a second silicon nitride layer 46 is formed on the side wall of the silicon oxide layer 56 by a etch-back process. After this processing, the silicon oxide layer 56 is removed by a conventional wet-etching process, and an exposed portion of the first silicon nitride layer 54 and the pad oxide layer 51 under the exposed portion are removed for exposing the surface of the substrate 8 by a conventional dry-etching or wet-etching process. Then a gate oxide layer 42 having a thickness of about 250 Å is grown on the exposed substrate surface, and a polycrystalline silicon layer having a thickness of about 1500 Å is deposited on all the surface by a conventional LPCVD (Low Pressure Chemical Vapor Deposition). Thereafter the polycrystalline silicon 58 is converted into a layer of conductivity type by doping N-type impurity such as POCl$_3$, but N+ doped polycrystalline silicon 58 can be deposited.

Figure 4E:
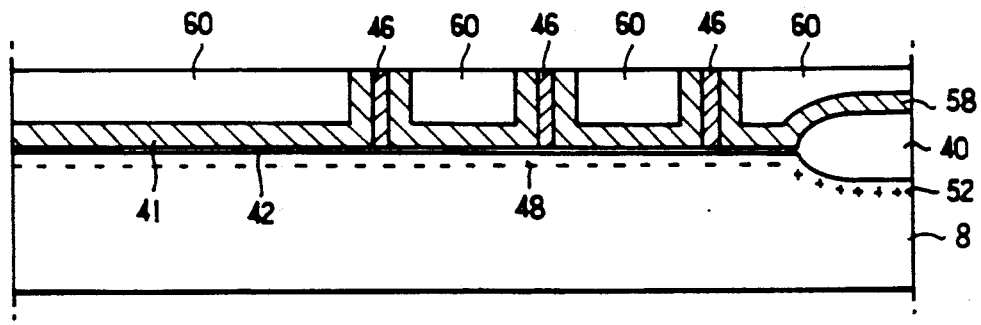

Thereafter, as shown in FIG. 4(E), after forming the doped polycrystalline silicon 58 layer, the polycrystalline silicon 58 is covered with a coating of photoresist 60 and removed by an etch-back process until the upper surface of the side wall layer 46 is exposed. Therefore, because of the etch back process, it is to be understood that the height of the isolated layer 46 from the substrate surface 8 should be higher than the sum of a height of the field oxide layer from the substrate surface 8 and a thickness of the polycrystalline silicon layer 58. And the photoresistor 60 is removed. Then, the gate electrodes 44 of the ROM cells 21 to 27 are insulated with the gate electrodes of adjacent cells by the side wall layers 46.

Figure 4F:
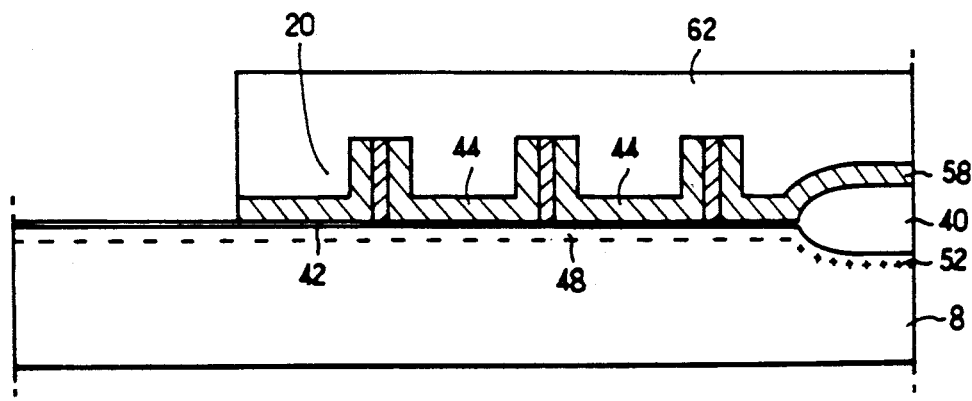

As shown in FIG. 4(F), gate electrodes (not illustrated) of the string select cell 20 and ROM cell 28 are specified by depositing a photoresist layer 62 and etching polycrystalline silicon.

Figure 4G:
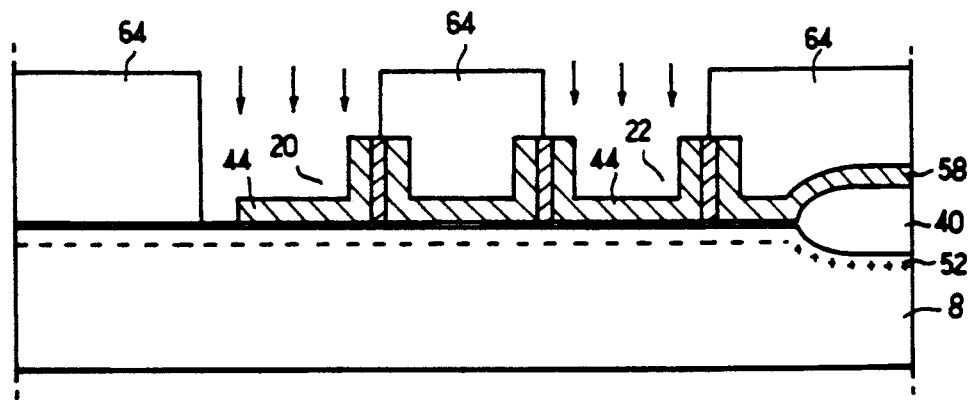

As shown in FIG. 4(G), a photo resistor 64 is formed in order to expose the string select cell 20 and gate electrodes 44 of the selected ROM cell 22 to be programmed. Then boron ions are implanted with an energy of 75 KeV and a dose of about $3 \times 10^{12}$ ions/cm$^2$. By means of ion implantation with boron the string select cell 20 and the ROM cell 22 are programmed into the enhancement mode.

After removing the photoresist 64, as shown in FIG. 2, and forming the N+ connection region 16 and N+ reference region 18 by means of an ion implantation process, insulating layer 50 such as SiO2, PSG or BPSG is deposited on the entire surface. The open hole 12 is formed for exposing a portion of the N+ connection region 16, and a column line 10 is formed by coating a metal such as Al and by patterning technology.

A mask ROM according to the present invention described above can relatively have the geometric structure of high-density because a width of the side wall layer can be minimized. Furthermore, it has an advantage that channel resistance is reduced by the extension of the channel region due to eliminating sources and drains of the conventional MOSFET transistors. It is another advantage of the invention that can prevent the ion implantation of undesired portions by means of the polycrystalline silicon formed on the side wall of the isolation layer for isolating the gates while executing the photolithography process and ion implantation for programming, after forming the polycrystalline silicon gate of the cell.

The foregoing description shows only a preferred embodiment of the present invention. Various modifications are apparent to those skilled in the art without departing from the scope of the present invention which is only limited by the appended claims. For example, a mask read only memory may be constructed according to the foregoing according to the foregoing principles with side wall layers made of silicon nitride ($Si_3N_4$) layers or a multi-layer structure may be constructed using silicon nitride ($Si_3N_4$). Therefore, the embodiment shown and described is only illustrative, not restrictive.

What is claimed is:

1. A mask read only memory having a plurality of memory strings with a plurality of memory cells formed on a surface of a substrate of a first conduction type and connected between each of a plurality of contact regions of a second conduction type on the substrate and a reference region of the second conduction type, comprising:
   each of said memory strings having a plurality of spaced-apart side wall layers with each of said side wall layers in each of said memory strings being separated and spaced-apart in an array disposed between a connection region and reference region in order to isolate the memory cells in each of said memory strings;
   gate oxide layers formed on the surface of said substrate on which said memory cells are formed;
   gate electrodes formed between side walls of the side wall layers and over each of said gate oxide layers and adjacent memory cells;
   channel regions having ions of the first conduction type under a memory cell adjacent to said connection region and oxide layers of a selected memory cell or cells; and
   channel regions having ions of the second conduction type under oxide layer or layers of a non-selected memory cell or cells and said side wall layers; and
   a plurality of said channel regions being contiguous and series connected in each of said memory strings.

2. A mask read only memory according to claim 1, wherein said side wall layers are silicon nitride ($Si_3N_4$).

3. A mask read only memory according to claim 1, wherein a memory cell adjacent to said connection region is a string selection cell.

4. A mask read only memory, comprising:
   a substrate of a semiconductor material exhibiting a first conductivity type;
   a plurality of memory strings each having a plurality of memory cells formed on one surface of said substrate and connected between a reference region of a second conductivity type and each of a plurality of connection regions of the second conductivity type on said semiconductor substrate;
   means separated by a set distance between said connection regions and said reference region, for isolating said memory cells of each of said memory strings;
   a plurality of gate oxide layers formed on said surface of said substrate;
   a plurality of gate electrodes formed over said isolating means, between each of said isolating means and over corresponding ones of said memory cells;
   channel regions of the first conductivity type disposed within said substrate under a memory cell adjacent to one of the connection regions and oxide layers of selected memory cells;
   channel regions of the second conductivity type disposed under oxide layers of a non-selected memory cell and said isolating means; and
   a plurality of said channel regions in each of said memory strings being contiguous and coupled in series.

5. The mask read only memory of claim 4, wherein said isolating means comprises layers of $Si_3N_4$.

6. A mask read only memory according to claim 4, wherein a memory cell adjacent to one of said connection regions comprises a string selection cell.

7. The read only memory of claim 4, further comprised of said plurality of memory strings being disposed in parallel arrays with said memory cells in adjacent ones of said parallel arrays being aligned in a direction transverse to said parallel arrays.

8. The read only memory of claim 7, further comprised of a plurality of field oxide layers separating said plurality of gate oxide layers.

9. The read only memory of claim 4, wherein said isolating means comprises a plurality of spaced-apart members of electrically insulating material, exhibiting major dimensions along lines extending transversely away from said surface of said substrate.

10. The read only memory of claim 4, wherein said isolating means comprises a plurality of discrete spaced-apart layers of electrically insulating material, disposed upon and extending vertically away from said surface of said substrate.

11. The read only memory of claim 8, wherein said isolating means comprises a plurality of discrete spaced-apart layers of electrically insulating material, disposed upon and having heights extending in a direction vertically away from said surface of said substrate, with the heights of isolating means exceeding a cumulative thickness of a field oxide layer and any material of said gate electrode disposed over said field oxide layer.

12. The read only memory of claim 7, further comprised of said isolating means comprising a plurality of discrete spaced-apart layers of electrically insulating material, aligned with said direction and extending generally parallel to said memory cells across said plurality of memory strings.

13. A read only memory, comprising:
   a substrate of a semiconductor material exhibiting a first conductivity type;
   a plurality of memory strings each having a plurality of memory cells formed on one surface of said substrate and connected between a reference region of a second conductivity type and each of a plurality of contact regions of the second conductivity type on said semiconductor substrate;
   a plurality of discrete spaced-apart layers of electrically insulating material disposed between said contact regions and reference region, aligned and extending generally parallel to said memory cells across said plurality of memory strings;
   a plurality of gate oxide layers formed on said surface of said substrate;
   a plurality of gate electrodes formed over corresponding ones of said gate oxide layers, between corresponding ones of said isolating means and over corresponding ones of said memory cells, for corresponding ones of said memory cells, with successive ones of said gate oxide layers in each of said strings being separated by intermediate ones of said spaced-apart layers;
   a channel region of the first conductivity type disposed within said substrate under a memory cell adjacent to one of the contact regions and oxide layer of a selected memory cell;

channel regions of the second conductivity type disposed under an oxide layer of a non-selected memory cell; and said channel regions of said first and second conductivity types in each of said memory strings being contiguous and coupled in series.

14. The mask read only memory of claim 13, wherein said insulating material is comprised of Si$_3$N$_4$.

15. A mask read only memory according to claim 13, wherein said memory cell adjacent to said contact region comprises a string selection cell.

16. The read only memory of claim 13, further comprised of said plurality of memory strings being disposed in parallel arrays with said memory cells in adjacent ones of said parallel arrays being aligned in a direction transverse to said parallel arrays.

17. The read only memory of claim 13, further comprised of a plurality of field oxide layers separating said plurality of memory strings.

18. The read only memory of claim 13, further comprised of said spaced-apart layers exhibiting major dimensions along lines extending transversely away from said surface of said substrate.

19. The read only memory of claim 13, further comprised of said space-apart layers being disposed upon and extending vertically away from said surface of said substrate.

20. The read only memory of claim 17, further comprised of said spaced-apart layers being disposed upon and having heights extending in a direction vertically away from said surface of said substrate, with the heights of said spaced-apart layers exceeding a cumulative thickness of one of said field oxide layers and any material of said gate electrode disposed over said field oxide layer.

21. A mask read only memory having a plurality of memory strings with a plurality of memory cells formed on a surface of a substrate of a first conduction type and connected between each of a plurality of contact regions of a second conduction type on the substrate and a reference region of the second conduction type, comprising:

gate oxide layers formed on the surface of said substrate on which said memory cells are formed;

channel regions having ions of the first conduction type under one of said memory cells adjacent to a connection region and oxide layers of a selected memory cell or cells;

channel regions having ions of the second conduction type under oxide layer or layers of a non-selected memory cell or cells;

a plurality of said channel regions being connected in series in each of said memory strings;

each of said memory strings having a plurality of spaced-apart side wall layers disposed over said channel regions, with each of said side wall layers in each of said memory strings being spaced-apart in an array disposed between said connection region and a reference region in order to isolate the memory cells in each of said memory strings; and gate electrodes formed between side walls of the side wall layers and over each of said gate oxide layers and adjacent memory cells.

22. The read only memory of claim 21, further comprised of said plurality of channel regions being contiguous.

23. A mask read only memory having a plurality of memory strings with a plurality of memory cells formed on a surface of a substrate of a first conduction type and connected between each of a plurality of contact regions of a second conduction type on the substrate and a reference region of the second conduction type, comprising:

gate oxide layers formed on the surface of said substrate on which said memory cells are formed;

channel regions having ions of either the first conduction type or the second conduction type under said oxide layers of said plurality of memory cells extending from a connection region;

a plurality of said channel regions being connected in series in each of said memory strings;

each of said memory strings having a plurality of spaced-apart side wall layers disposed over said channel regions, with each of said side wall layers in each of said memory strings being spaced-apart in an array disposed between said connection region and a reference region in order to isolate memory cells in each of said memory memory strings; and gate electrodes formed between side walls of the side wall layers and over each of said gate oxide layers and adjacent memory cells.

24. The read only memory of claim 23, further comprised of said plurality of channel regions being contiguous.

* * * * *

UNITED STATES PATENT AND TRADEMARK OFFICE
CERTIFICATE OF CORRECTION

PATENT NO. :     5,067,001
DATED      :     19 November 1991
INVENTOR(S):     Jung-Hyuk CHOI It is certified that error appears in the above-identified patent and that said Letters Patent is hereby corrected as shown below:

Column 1,   Line 46,   replace "according" with --accordingly--;

Line 56,   replace "pluality" with --plurality--;

Column 2,   Line 15,   delete "to the";

Line 43,   delete "a" (first occurrence);

Line 44,   delete "an";

Column 3,   Line 11,   replace "a" (first occurrence) with --an--;

Line 15,   insert --a-- after "in";

Line 38,   delete "are"; insert "as"

Line 68,   replace "in" with --as--;

Column 4,   Line 1,    replace "an" with --a--;

Line 3,    replace "a" with --an--;

Line 12,   delete "all";

Line 13,   insert --entire-- before "surface".

UNITED STATES PATENT AND TRADEMARK OFFICE
CERTIFICATE OF CORRECTION

PATENT NO. : 5,067,001
DATED : November 19, 1991
INVENTOR(S) : Jung-Hyuk Choi

It is certified that error appears in the above-identified patent and that said Letters Patent is hereby corrected as shown below:

Column 4, line 13, insert --entire-- before "surface".

Signed and Sealed this

Second Day of June, 1992

*Attest:*

DOUGLAS B. COMER

*Attesting Officer*         Acting Commissioner of Patents and Trademarks